US006319829B1

United States Patent
(12) United States Patent
Pasco et al.

(10) Patent No.: US 6,319,829 B1
(45) Date of Patent: Nov. 20, 2001

(54) ENHANCED INTERCONNECTION TO CERAMIC SUBSTRATES

(75) Inventors: Robert W. Pasco, Wappingers Falls; Srinivasa S. N. Reddy, Lagrangeville; Rao V. Vallabhaneni, Hopewell Junction, all of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/376,599

(22) Filed: Aug. 18, 1999

(51) Int. Cl.[7] .................................................... H01L 21/44

(52) U.S. Cl. ......................... 438/678; 438/106; 438/107; 438/108; 438/109; 438/121; 257/700; 257/703; 257/708; 439/66; 439/91; 439/591

(58) Field of Search .................................... 438/106–109, 438/121; 257/678, 700, 703, 708; 439/91, 66, 591

(56) References Cited

U.S. PATENT DOCUMENTS

| | | | | |
|---|---|---|---|---|
| 4,074,342 | | 2/1978 | Honn et al. . | |
| 4,603,023 | * | 7/1986 | Mack et al. | 264/135 |
| 4,617,730 | | 10/1986 | Geldermans et al. . | |
| 4,855,871 | | 8/1989 | Young . | |
| 5,073,840 | | 12/1991 | Coors . | |
| 5,177,594 | | 1/1993 | Chance et al. . | |
| 5,313,366 | | 5/1994 | Gaudenzi et al. . | |
| 5,404,044 | | 4/1995 | Booth et al. . | |
| 5,473,120 | * | 12/1995 | Ito et al. | 174/264 |
| 5,474,458 | | 12/1995 | Yafi et al. . | |
| 5,484,647 | | 1/1996 | Nakatani et al. . | |
| 5,504,035 | * | 4/1996 | Rostoker et al. | 228/180.22 |
| 5,571,593 | | 11/1996 | Arldt et al. . | |
| 5,668,059 | | 9/1997 | Christie et al. . | |
| 5,866,948 | * | 2/1999 | Murakami et al. | 257/778 |
| 6,050,832 | * | 4/2000 | Lee et al. | 439/91 |

OTHER PUBLICATIONS

Schueller et al, 1997 IEEE/CPMT Electronic Packaging Technology Conference, 219–227.*

IBM Technical Disclosure Bulletin—vol. 37, No. 02A, Feb. 1994; No. 04B, Apr. 1994; No. 10, Oct. 1994; No. 11, Nov. 1994; vol. 36, No. 12, Dec. 1993; vol. 32, No. 3B, Aug. 1989; vol. 24, No. 12, May 1982; vol. 24, No. 6, Nov. 1981.

* cited by examiner

*Primary Examiner*—Matthew Smith
*Assistant Examiner*—Craig P. Lytle
(74) *Attorney, Agent, or Firm*—Wood, Phillips, VanSanten, Clark & Mortimer

(57) ABSTRACT

A semiconductor chip interposer increases fatigue life of interconnections between a first component having a relatively high thermal coefficient of expansion (TCE) and a second component having a relatively low TCE. The semiconductor chip interposer includes a thin metal plate having a plurality of through holes, the thin metal plate having a TCE intermediate the relatively high TCE and the relatively low TCE. An insulation coating on the thin metal plate is also included on walls of the through holes. An electrical conductive material fills each of the insulated through holes for electrical interconnection between the first component and the second component.

11 Claims, 3 Drawing Sheets

ENHANCED INTERCONNECTION TO CERAMIC SUBSTRATES

FIELD OF THE INVENTION

This invention relates to integrated circuit construction and, more particularly, to an enhanced interconnection to ceramic substrates of a semiconductor chip or printed circuit board.

BACKGROUND OF THE INVENTION

The evolution of electrical and electronic circuitry from component circuits to integrated circuits, particularly microelectronic integrated circuits, has presented various new considerations in circuit design. Among these considerations is the necessity of connecting circuits on the semiconductor chip to other chips or devices mounted on a printed circuit board. This is because not all connections can be made inside a single chip. Therefore, it is necessary to connect externally to different I/O areas with external conductors, such as wires. Likewise, power must be supplied to the semiconductor chips.

In order to eliminate use of wiring, chip carriers have found widespread use. The chip carrier consists of a substrate having I/O pads on either side with internal connections between the I/O pads. Referring to FIG. 1, an exemplary such prior art integrated circuit is illustrated with a semiconductor chip 10, a chip carrier 12, and a printed circuit board 14. The chip 10 is connected to I/O pads of the chip carrier 12 using, for example, solder balls 16. Likewise, opposite I/O pads of the chip carrier 12 are connected to the board using solder balls 16. As is known, interconnections can also be provided by controlled collapsible chip connectors (C4s), columns, pins or the like. The solder balls 16 on either side of the chip carrier 12 are formed in an array corresponding to the location of the I/O pads. This construction is conventionally referred to as a ball grid array (BGA). Although not shown, the chip carrier 12 may be modified to include pins brazed to the I/O pads for connection to the board 14 to define a pin grid array (PGA).

With a conventional design, such as illustrated in FIG. 1, the chip has a relatively low thermal coefficient of expansion (TCE) on the order of 3 ppm/° C. The chip carrier 12 is typically constructed of a glass ceramic and also has a TCE of about 3 ppm/° C. The board 14 which is typically constructed of an organic material has a substantially higher TCE on the order of about 19 ppm/° C., typically. The difference in thermal expansion, particularly between the carrier 12 and the board 14, limits reliability due to fatigue from thermal cycling of the interconnections between the chip carrier 12 and the board 14. The fatigue occurs in thermal on/off cycling due to the thermal expansion mismatch between the carrier 12 and board 14 which are joined, for example, by solder. Depending on construction of the carrier 12, the chip 10 to carrier 12 interconnects can also be affected by this phenomenon.

The present invention is directed to overcoming one or more of the problems discussed above, in a novel and simple manner.

SUMMARY OF THE INVENTION

In accordance with the invention, there is provided a semiconductor chip interposer for increasing fatigue life of interconnections by distributing mismatch of thermal coefficient of expansion between circuit components.

Broadly, there is disclosed herein a semiconductor chip interposer for increasing fatigue life of interconnections between a first component having a relatively high thermal coefficient of expansion (TCE) and a second component having a relatively low TCE. The interposer comprises a thin substrate having a TCE intermediate the relatively high TCE and the relatively low TCE and a plurality of through holes that are electrically insulated from one another. An electrical conductive material fills each of the insulated through holes for electrical interconnection between the first component and the second component.

In one embodiment of the invention the substrate is a thin metal plate having a thickness in the range of 2–8 mils. The substrate includes an insulation coating on the thin metal plate including on walls of the through holes. The insulation coating comprises an oxide coating.

In another embodiment of the invention the substrate comprises a ceramic substrate.

There is disclosed in accordance with another aspect of the invention a semiconductor chip interposer including a thin metal plate having a plurality of through holes, the thin metal plate having a TCE intermediate the relatively high TCE and the relatively low TCE. An insulation coating on the thin metal plate is also included on walls of the through holes. An electrical conductive material fills each of the insulated through holes for electrical interconnection between the first component and the second component.

It is a feature of the invention that the thin metal plate is a metal foil having a thickness in the range of 2–8 mils.

It is another feature of the invention that the insulation coating comprises an oxide coating.

It is still a further feature of the invention that the chip comprises a multi-chip module and the interposer comprises a segmented interposer.

It is still another feature of the invention to provide conductive I/O pads on either side of the through openings electrically connected to the conductive material.

It is yet another feature of the invention that the second component is a glass/ceramic substrate having I/O pads and the interposer is joined to the substrate by co-sintering the substrate I/O pads and the interposer I/O pads.

It is still a further feature of the invention to provide conductive pins brazed to I/O pads on one side of the interposer. In one aspect, the second component is a glass/ceramic substrate having I/O pads and the interposer is joined to the substrate by co-sintering using the substrate I/O pads and the interposer I/O pads to provide a glass-ceramic pin grid array.

Further features and advantages of the invention will be readily apparent from the specification and from the drawing.

DETAILED DESCRIPTION OF THE INVENTION

Figure 1:
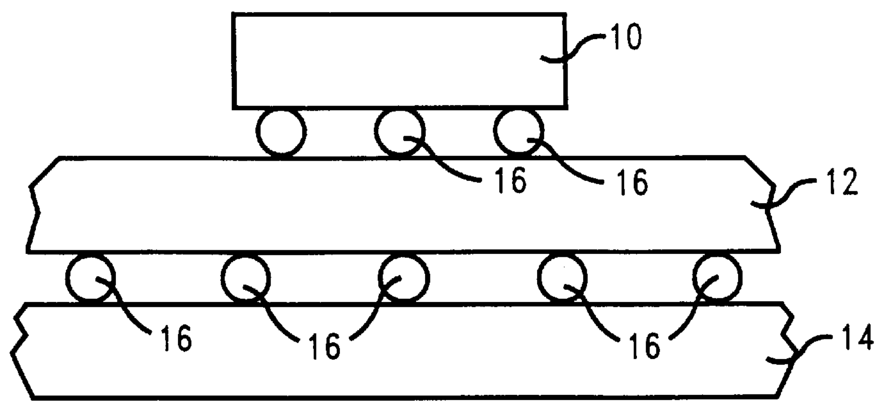
FIG. 1 is a side elevation view of a prior art integrated circuit.
Figure 2:
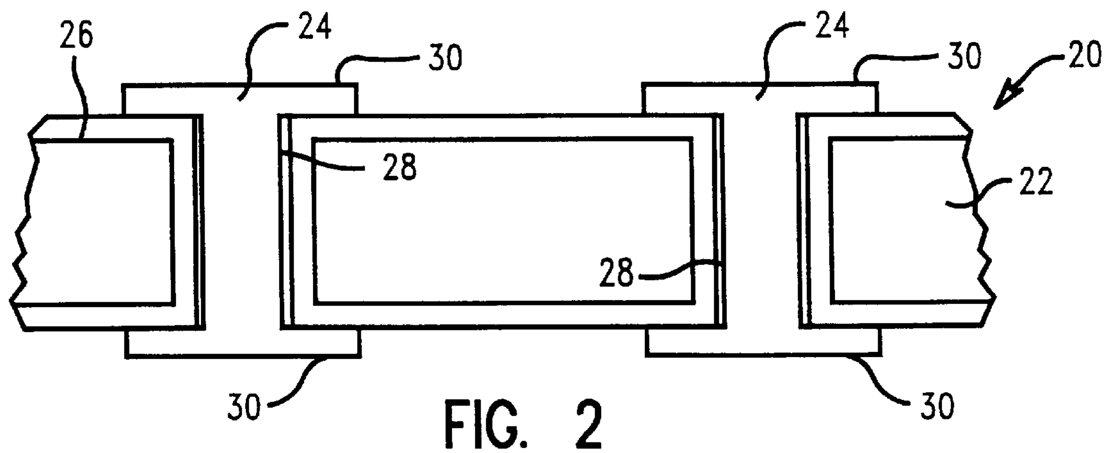
FIG. 2 is a partial sectional view of a semiconductor chip interposer according to the invention.

With reference to FIG. 2, a semiconductor chip interposer 20 according to the invention is illustrated. The interposer 20 is adapted to distribute mismatches of thermal coefficients of expansion (TCE) between various components in an integrated circuit, such as that shown in FIG. 1 and discussed above. Particularly, interconnection between, for a ceramic chip carrier and board interconnection is accomplished using a thin interposer which has a thermal coefficient of expansion intermediate the TCE of the ceramic chip carrier and the TCE of the board. As an example, if the ceramic chip carrier has a TCE of 3 ppm/° C. and the board has a TCE of 19 ppm/° C., as discussed relative to FIG. 1, then the interposer will have a TCE in the range of about 10–14 ppm/° C.

The interposer 20 comprises a thin metal plate 22 having through openings or via holes 24 through the plate 22. The via holes 24 may be formed in any known manner, such as drilling, etching, etc. The via holes 24 are patterned according the bottom surface metallurgy (BSM) of the corresponding component with which it will be used. The metal plate 22 may be, for example, stainless steel, nickel, aluminum, Ti, Ti—Al, Ti—Al—V, or the like. The thickness of the plate 22 should be greater than 2 mils. For example, the plate 22 might be a metal foil in the range of 2–8 mil thickness.

To provide insulation between via holes 24, an insulation coating 26 is provided on the plate 22, including on walls of the via holes 24. Advantageously, the insulation coating 26 comprises an oxide coating. The oxide coating 26 may be a thermally grown oxide or be formed by anodization. Using conventional masking technology, the via holes 24 with the insulation coating 26 are filled with an electrical conductive material 28 and to form I/O pad 30 on both sides. The via conductive material 28 and the I/O pads 30 may be formed, for example, of materials such as Cu, Cu—Ni, Ni, Ag, Au or Pd.

As an alternative, the interposer may be constructed of a ceramic material having a TCE intermediate that of the carrier and board with which it will be used. Such a ceramic material would appropriately distribute the mismatch, as discussed above. If ceramic is used, then the oxide coating is not necessary, as is apparent.

As is apparent, the specific size and number of interconnects utilized in the interposer 20 depends on the particular circuit design.

Figure 3:
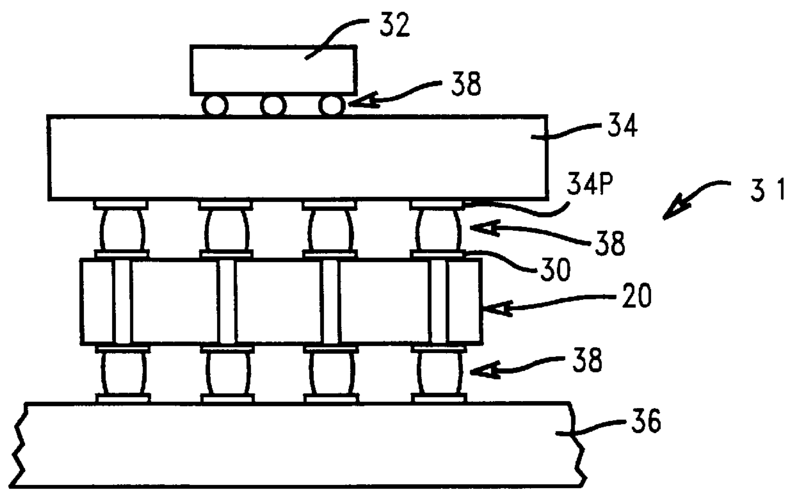
FIG. 3 is a side elevation view of an integrated circuit single chip module, similar to FIG. 1, including the interposer of FIG. 2 illustrated in section.

Referring to FIG. 3, the interposer 20 according to the invention is illustrated in a single chip module (SCM) 31 including a chip 32, a glass ceramic substrate 34, and the circuit board 36. Solder balls 38 are used to provide interconnection between the chip 32 and the carrier 34. Likewise, solder balls 38 are used for the interconnections between carrier I/O pads 34P and the interposer I/O pads 30 and between the interposer I/O pads 30 and the board 36.

In such an application, the carrier 34 might have a TCE in the range of 3–7 ppm/° C., while the board might have a TCE greater than 20 ppm/° C. The metallic interposer 20 in accordance with the invention could then have a TCE in the range of, for example, 10–16 ppm/° C. Instead of a mismatch on the order of about 16 ppm/° C., as with the circuit of FIG. 1, the interposer 20 provides two smaller mismatches, on the order of about 6–10 ppm/° C. Thus interconnections on either side of the interposer 20 are subject to less fatigue to increase and enhance reliability and component life.

Figure 4:
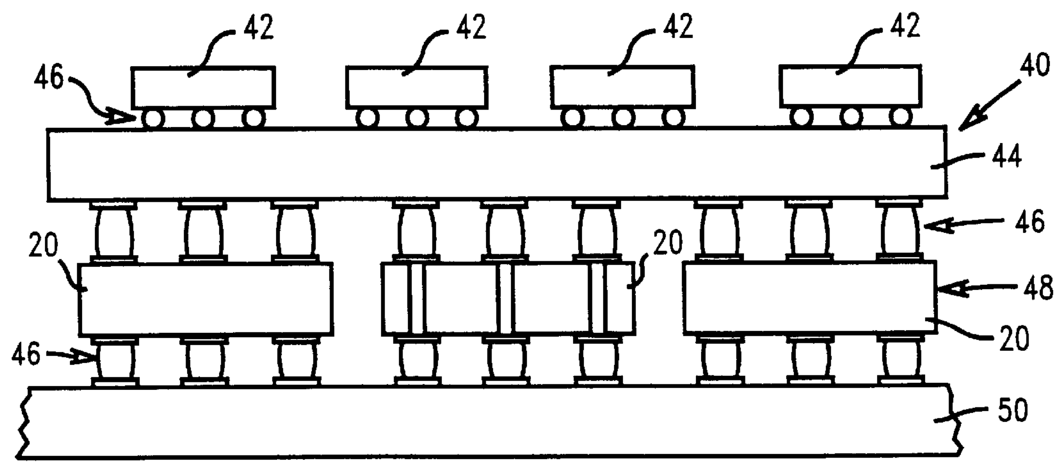
FIG. 4 is a side elevation view, similar to that of FIG. 3, illustrating a segmented interposer according to the invention in a multichip module.

FIG. 4 illustrates use of an interposer in accordance with the invention with a multichip module 40. The multichip module 40 includes plural chips 42 connected to a large ceramic substrate 44 using solder balls 46. A segmented interposer 48 according to the invention provides interconnection between the substrate 44 and a printed circuit board 50 using solder balls 46. The segmented interposer 48 comprises plural smaller area interposers 20, thus reducing the distance to neutral point (DNP) and the effect of stresses on the interconnect, given the same TCEs and temperature cycling as discussed above relative to FIG. 3.

Figure 5:
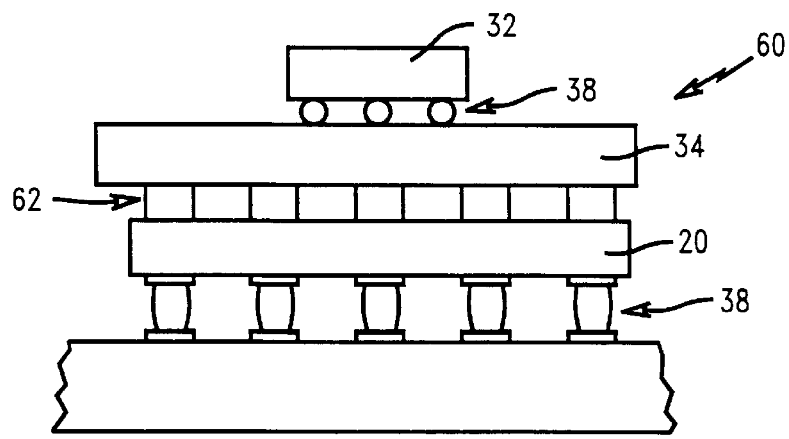
FIG. 5 is a side elevation view of an integrated circuit having a carrier and the interposer according to the invention joined by co-sintering.
Figure 6:
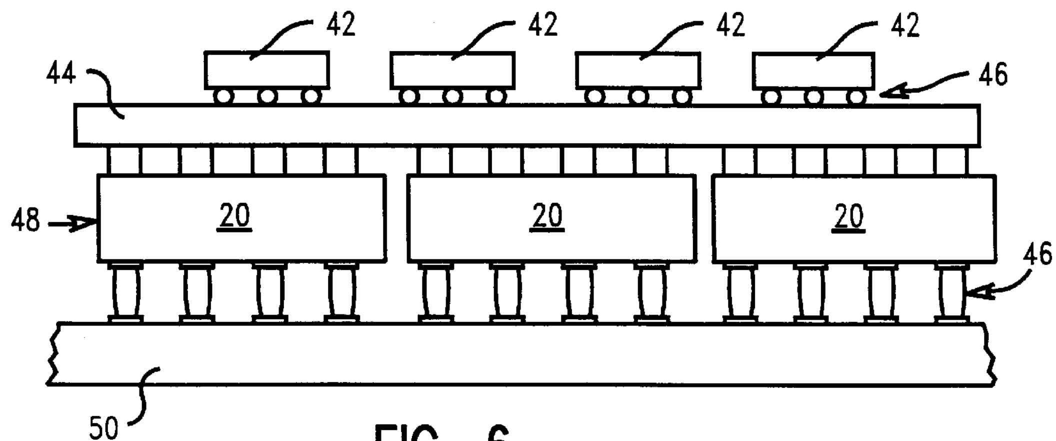
FIG. 6 is a side elevation view, similar to that of FIG. 5, for a multichip module.

With reference to FIG. 5, a single chip module 60 is illustrated. The SCM 60 is similar to that shown in FIG. 3, except that the interposer 20 is joined to the carrier 34 by co-sintering the carrier I/O pad 34P of FIG. 3 and the interposer I/O pads 30 to produce a connection 62. Similarly, FIG. 6 illustrates the extension of the SCM 60 of FIG. 5 to an MCM, as with FIG. 4 relative to FIG. 3.

Figure 7:
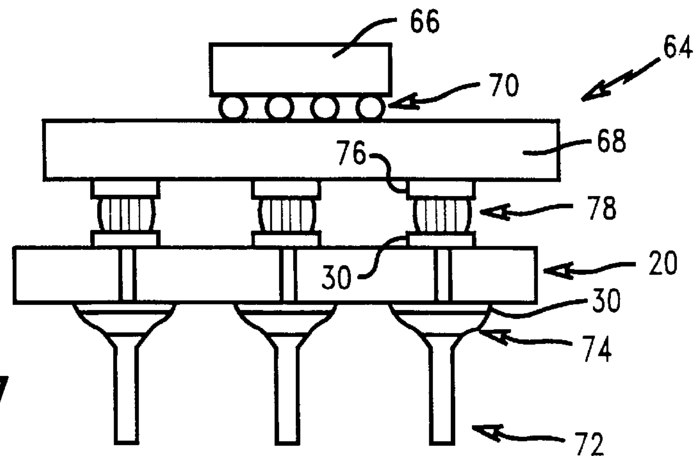
FIG. 7 is a side elevation view of a glass-ceramic pin grid array using the interposer according to the invention.

Referring to FIG. 7, a glass ceramic pin grid array (PGA) module 64 according to the invention is illustrated. A semiconductor chip 66 is connected to a glass ceramic substrate 68 using solder balls 70. Pins 72 are brazed to the interposer I/O pads 30 on one side. The pins 72 are preferably Kovar pins and utilize a Cu—Ag braze 74. The braze 74 may alternately use materials such as Cu—Sil and Au—Sn. The pins 72 and I/O pads 30 are electroplated with nickel and gold. The interposer I/O pads 30 on the other side are joined to glass ceramic BSM I/O pads 76 with a thin solder joint 78. The solder joint 78 could be formed using a soft solder, such as Pb—Sn. Alternatively, the interposer 20 is prejoined to the substrate 68 by co-sintering with the ceramic and then pins are brazed on the other side of the interposer, as described above.

Figure 8:
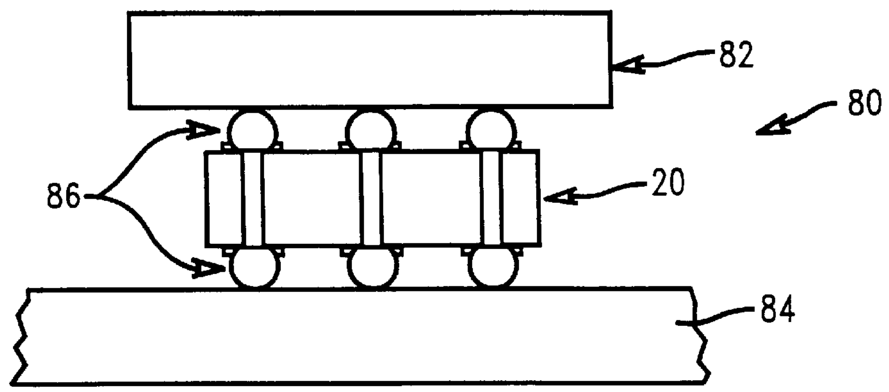
FIG. 8 is a side elevation view showing the interposer according to the invention interconnecting a chip to a circuit board.

Finally, referring to FIG. 8, an SCM 80 illustrates use of the interposer 20 for attaching a semiconductor chip 82 to an organic card or board 84 using solder balls 86. In this embodiment, a chip carrier is not utilized. As with the embodiments discussed above, the interposer 20 has its TCE intermediate between those of the chip 82 and the organic card or board 84.

The appended figures provide a general overview of the interposer concept in accordance with the invention as a means for enhancing TCE-related fatigue reliability. The selection of interposer material, such as metal or ceramic, and the method of processing is otherwise obvious to those skilled in the art after reviewing the concepts described herein.

We claim:

1. A semiconductor chip interposer for increasing fatigue life of interconnections between a first component having a relatively high thermal coefficient of expansion (TCE) and a second component having a relatively low TCE, comprising:

a thin substrate having a TCE intermediate the relatively high TCE and the relatively low TCE and a plurality of through holes that are electrically insulated from one another, wherein the substrate is a thin metal plate having a thickness in the range of 2–8 mil; and an electrical conductive material filling each of the insulated through holes for electrical interconnection between the first component and the second component.

2. The interposer of claim 1 wherein the substrate includes an insulation coating on said thin metal plate including on walls of the through holes.

3. The interposer of claim 2 wherein the insulation coating comprises an oxide coating.

4. A semiconductor chip interposer for increasing fatigue life of interconnections between a first component having a relatively high thermal coefficient of expansion (TCE) and a second component having a relatively low TCE, comprising:

a thin metal plate having a plurality of through holes, the thin metal plate having a TCE intermediate the relatively high TCE and the relatively low TCE;

an insulation coating on said thin metal plate including on walls of the through holes; and an electrical conductive material filling each of the insulated through holes for electrical interconnection between the first component and the second component.

5. The interposer of claim 4 wherein the thin metal plate is a metal foil having a thickness in the range of 2–8 mil.

6. The interposer of claim 4 wherein the insulation coating comprises an oxide coating.

7. The interposer of claim 4 wherein the chip comprises a multi-chip module and the interposer comprises a segmented interposer.

8. The interposer of claim 4 further comprising conductive I/O pads on either side of the through openings electrically connected to the conductive material.

9. The interposer of claim 8 wherein the second component is a glass-ceramic substrate having I/O pads and the interposer is joined to the substrate by co-sintering the substrate I/O pads and the interposer I/O pads.

10. The interposer of claim 8 further comprising conductive pins brazed to I/O pads on one side of the interposer.

11. The interposer of claim 10 wherein the second component is a glass-ceramic substrate having I/O pads and the interposer is joined to the substrate by co-sintering using the substrate I/O pads and the interposer I/O pads to provide a glass-ceramic pin grid array.

* * * * *